US012696647B2

(12) United States Patent
Zhang

(10) Patent No.: US 12,696,647 B2
(45) Date of Patent: Jul. 28, 2026

(54) DISPLAY PANEL AND DISPLAY APPARATUS

(71) Applicant: TCL CHINA STAR OPTOELECTRONICS TECHNOLOGY CO., LTD., Shenzhen (CN)

(72) Inventor: Sheng Zhang, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 842 days.

(21) Appl. No.: 17/623,803

(22) PCT Filed: Dec. 21, 2021

(86) PCT No.: PCT/CN2021/140225
§ 371 (c)(1),
(2) Date: Dec. 29, 2021

(87) PCT Pub. No.: WO2023/108735
PCT Pub. Date: Jun. 22, 2023

(65) Prior Publication Data
US 2024/0373711 A1 Nov. 7, 2024

(30) Foreign Application Priority Data
Dec. 16, 2021 (CN) .......................... 202111543923.8

(51) Int. Cl.
*H10K 59/35* (2023.01)
(52) U.S. Cl.
CPC ......... *H10K 59/353* (2023.02); *H10K 59/352* (2023.02)

(58) Field of Classification Search
CPC ........... H10K 59/30; H10K 59/35–353; H10K 59/121; H10K 59/352; H10H 29/14; H10H 29/34; H10H 29/345; H10H 29/352
See application file for complete search history.

(56) References Cited

U.S. PATENT DOCUMENTS

2008/0158097 A1 7/2008 Guo
2019/0131589 A1* 5/2019 Matsueda ............ H10K 71/166
(Continued)

FOREIGN PATENT DOCUMENTS

CN 104465714 A 3/2015
CN 107086239 A 8/2017
(Continued)

OTHER PUBLICATIONS

International Search Report in International application No. PCT/CN2021/140225, mailed on Apr. 28, 2022.
(Continued)

*Primary Examiner* — Julio J Maldonado
*Assistant Examiner* — Eric Manuel Mulero Flores
(74) *Attorney, Agent, or Firm* — PV IP PC; Peter Stecher; Wei Te Chung

(57) ABSTRACT

A display panel and a display apparatus are provided. The display panel includes a plurality of pixel structures, each of the pixel structures is disposed in a hexagon, the hexagon is divided into six triangles disposed around a center of the hexagon, one pixel structure includes six closely arranged pixel units, one pixel unit is correspondingly disposed in one triangle; in one pixel unit and one corresponding triangle, the pixel unit includes three sub-pixels of different colors respectively disposed on three vertex angles of the triangle.

14 Claims, 3 Drawing Sheets

(56)                           References Cited

U.S. PATENT DOCUMENTS

2020/0043990 A1 *  2/2020  Huangfu .............. H10K 59/123
2020/0212127 A1 *  7/2020  Choi ...................... H10K 50/11

FOREIGN PATENT DOCUMENTS

CN          107742638  A  *  2/2018  ........... H10K 59/353
CN          108281464  A      7/2018
CN          110473894  A     11/2019
CN          111883560  A  * 11/2020  ........... H10K 59/353
CN          111969022  A  * 11/2020  ........... H10K 59/353

OTHER PUBLICATIONS

Written Opinion of the International Search Authority in International application No. PCT/CN2021/140225, mailed on Apr. 28, 2022.
Chinese Office Action issued in corresponding Chinese Patent Application No. 202111543923.8 dated Jan. 17, 2025, pp. 1-7.

* cited by examiner

DISPLAY PANEL AND DISPLAY APPARATUS

FIELD OF INVENTION

The present disclosure relates to the field of display technologies, and in particular, to a display panel and a display apparatus.

BACKGROUND OF INVENTION

Compared with conventional liquid crystal display devices, conventional organic light-emitting diode (OLED) display panels have the advantages of low energy consumption, low production cost, self-luminous, wide viewing angle, fast corresponding speed, and the like. It is one of the popular research fields of display devices today, and is increasingly used in the field of mobile phones and tablet computers.

Currently, in a preparation process of OLED display devices, a fine metal mask (FMM) is usually used, and by using a vacuum evaporation organic material, an area and a shape of the organic material are controlled by using openings in the FMM to form an organic electroluminescent structure. However, since the FMM is generally limited by a minimum opening size and a minimum distance between openings, it is difficult to achieve both a high resolution and a high opening ratio for the display panel, that is, it is difficult to maintain the high opening ratio under the high resolution, otherwise, defects such as color mixing will easily occur.

SUMMARY OF THE INVENTION

Technical Problem

Embodiments of the present disclosure provide a display panel and a display apparatus to ease the deficiencies in the related art.

Technical Solution

To solve the foregoing technical problems, the present disclosure provides a display panel, including a plurality of pixel structures, wherein each of the pixel structures is disposed as a hexagon, the hexagon is divided into six triangles disposed around a center of the hexagon, one pixel structure includes six closely arranged pixel units, and one pixel unit is correspondingly disposed in one triangle;

in one pixel unit and one corresponding triangle, the pixel unit includes three sub-pixels respectively disposed on three vertex angles of the triangle, and the three sub-pixels have different colors; and in two adjacent pixel units, two adjacent sub-pixels located at the center of the hexagon have a same color, and two adjacent sub-pixels located at the vertex angles of the hexagon have a same color.

In the display panel provided by the present embodiment of the present disclosure, each of the pixel units includes a first color sub-pixel, a second color sub-pixel, and a third color sub-pixel, wherein the first color sub-pixel and the second color sub-pixel are respectively located at the two vertex angles of the triangle away from the center of the hexagon, and the third color sub-pixel is located at the vertex angle of the triangle close to the center of the hexagon.

In the display panel provided by the present embodiment of the present disclosure, in each of the pixel units, the first color sub-pixel and the second color sub-pixel have a first distance, the first color sub-pixel and the third color sub-pixel have a second distance, and the second color sub-pixel and the third color sub-pixel have a third distance, wherein the first distance is greater than the second distance and the second distance is greater than the third distance.

In the display panel provided by the present embodiment of the present disclosure, in each of the pixel units, a ratio of an area of the first color sub-pixel to an area of the second color sub-pixel to an area of the third color sub-pixel is 1:2.8:3.5.

In the display panel provided by the present embodiment of the present disclosure, the first color sub-pixel unit is one of a red sub-pixel or a green group pixel unit, and the second color sub-pixel unit is the other one of the red sub-pixel or the green group pixel unit.

In the display panel provided by the present embodiment of the present disclosure, in any two adjacent pixel structures, two adjacent first color sub-pixels located at adjacent positions of two hexagons are disposed adjacent to each other, and two adjacent second color sub-pixels located at the adjacent positions of the two hexagons are disposed adjacent to each other.

In the display panel provided by the present embodiment of the present disclosure, the display panel includes a plurality of first color sub-regions, a plurality of second color sub-regions, and a plurality of third color sub-regions;

one third color sub-region is disposed at a center of one hexagon, and in each of the pixel structures, any two adjacent third color sub-pixels are adjacent to each other and are disposed in the third color sub-region.

In the display panel provided by the present embodiment of the present disclosure, in the plurality of pixel structures, centers of the plurality of second color sub-regions and centers of the plurality of third color sub-regions are disposed at vertex angles of the hexagons;

three first color sub-regions and three second color sub-regions are disposed at vertex angles of one hexagon correspondingly, and the three first color sub-regions and the three second color sub-regions are alternately disposed;

six first color sub-pixels are disposed in one first color sub-region, and any two adjacent first color sub-pixels in the first color sub-region are adjacent to each other; and six second color sub-pixels are disposed in one second color sub-region, and any two adjacent second color sub-pixels in the second color sub-region are adjacent to each other.

In the display panel provided by the present embodiment of the present disclosure, a distance between any two adjacent pixel structures of the plurality of pixel structures is 10 um-30 um.

In the display panel provided by the present embodiment of the present disclosure, shapes of the three sub-pixels are triangles or sectors.

An embodiment of the present disclosure provides a display apparatus, including a display panel, wherein the display panel includes a plurality of pixel structures, each of the pixel structures is disposed as a hexagon, the hexagon is divided into six triangles disposed around a center of the hexagon, one pixel structure includes six closely arranged pixel units, and one pixel unit is correspondingly disposed in one triangle;

in one pixel unit and one corresponding triangle, the pixel unit includes three sub-pixels respectively disposed on three vertex angles of the triangle, and the three sub-pixels have different colors; and in two adjacent pixel units, two adjacent sub-pixels located at the center of the hexagon have a same color, and two adjacent sub-pixels located at the vertex angles of the hexagon have a same color.

In the display apparatus provided by the present embodiment of the present disclosure, each of the pixel units includes a first color sub-pixel, a second color sub-pixel, and a third color sub-pixel, wherein the first color sub-pixel and the second color sub-pixel are respectively located at the two vertex angles of the triangle away from the center of the hexagon, and the third color sub-pixel is located at the vertex angle of the triangle close to the center of the hexagon.

In the display apparatus provided by the present embodiment of the present disclosure, in each of the pixel units, the first color sub-pixel and the second color sub-pixel have a first distance, the first color sub-pixel and the third color sub-pixel have a second distance, and the second color sub-pixel and the third color sub-pixel have a third distance, wherein the first distance is greater than the second distance and the second distance is greater than the third distance.

In the display apparatus provided by the present embodiment of the present disclosure, in each of the pixel units, a ratio of an area of the first color sub-pixel to an area of the second color sub-pixel to an area of the third color sub-pixel is 1:2.8:3.5.

In the display apparatus provided by the present embodiment of the present disclosure, the first color sub-pixel unit is one of a red sub-pixel or a green group pixel unit, and the second color sub-pixel unit is the other one of the red sub-pixel or the green group pixel unit.

In the display apparatus provided by the present embodiment of the present disclosure, in any two adjacent pixel structures, two adjacent first color sub-pixels located at adjacent positions of two hexagons are disposed adjacent to each other, and two adjacent second color sub-pixels located at the adjacent positions of the two hexagons are disposed adjacent to each other.

In the display apparatus provided by the present embodiment of the present disclosure, the display panel includes a plurality of first color sub-regions, a plurality of second color sub-regions, and a plurality of third color sub-regions;

one third color sub-region is disposed at a center of one hexagon, and in each of the pixel structures, any two adjacent third color sub-pixels are adjacent to each other and are disposed in the third color sub-region.

In the display apparatus provided by the present embodiment of the present disclosure, in the plurality of pixel structures, centers of the plurality of second color sub-regions and centers of the plurality of third color sub-regions are disposed at vertex angles of the hexagons;

three first color sub-regions and three second color sub-regions are disposed at vertex angles of one hexagon correspondingly, and the three first color sub-regions and the three second color sub-regions are alternately disposed;

six first color sub-pixels are disposed in one first color sub-region, and any two adjacent first color sub-pixels in the first color sub-region are adjacent to each other; and six second color sub-pixels are disposed in one second color sub-region, and any two adjacent second color sub-pixels in the second color sub-region are adjacent to each other.

In the display apparatus provided by the present embodiment of the present disclosure, a distance between any two adjacent pixel structures of the plurality of pixel structures is 10 um-30 um.

In the display apparatus provided by the present embodiment of the present disclosure, shapes of the three sub-pixels are triangles or sectors.

Beneficial Effects

The beneficial effects of the embodiments of the present disclosure are as follows: the embodiments of the present disclosure provide a display panel and a display apparatus, the display panel includes a plurality of pixel structures, each of the pixel structures is disposed as a hexagon, the hexagon is divided into six triangles disposed around a center of the hexagon, one pixel structure includes six closely arranged pixel units, and one pixel unit is correspondingly disposed in one triangle; in one pixel unit and one corresponding triangle, the pixel unit includes three sub-pixels respectively disposed on three vertex angles of the triangle, in and the three sub-pixels have different colors; and in two adjacent pixel units, two adjacent sub-pixels located at the center of the hexagon have a same color, and two adjacent sub-pixels located at the vertex angles of the hexagon have a same color. Therefore, during preparation of the pixel structures, the two adjacent sub-pixels of the same color can share one opening in a fine metal mask (FMM) for evaporation, so that accuracy requirements for the FMM are reduced. In addition, in the present embodiment of the present disclosure, in the two adjacent pixel units, the two adjacent sub-pixels located at the center of the hexagon have the same color. Therefore, during preparation of the pixel structures, one opening in the FMM may correspond to six sub-pixels for evaporation, to improve an opening ratio.

BRIEF DESCRIPTION OF DRAWINGS

The following describes specific implementations of the present disclosure in detail with reference to the accompanying drawings, to make the technical solutions and other beneficial effects of the present disclosure obvious.

DETAILED DESCRIPTION OF PREFERRED EMBODIMENTS

The present disclosure provides a display panel and a display device. To make the objectives, the technical solutions, and the effects of the present disclosure more comprehensible, the following further describes the present disclosure in detail with reference to the accompanying drawings and the embodiments. It should be understood that specific embodiments described herein are only used to describe the present disclosure instead of limiting the present disclosure.

Figure 1:
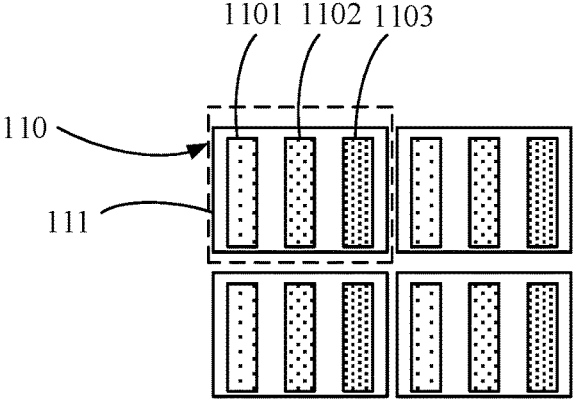
FIG. 1 is a top view of a pixel structure of a conventional display panel.

FIG. 1 is a top view of a pixel structure of a conventional display panel.

In a conventional display panel, the display panel includes a plurality of pixel structures 110 disposed in arrays. Each of the pixel structures 110 includes a pixel unit 111. The pixel unit 111 includes a red sub-pixel 1101, a green sub-pixel 1102, and a blue sub-pixel 1103 spaced apart from each other. The red sub-pixel 1101, the green sub-pixel 1102, and the blue sub-pixel 1103 are sequentially arranged in a cyclic manner.

In a conventional preparation process of the display panel, when a fine metal mask (FMM) corresponding to the pixel structure 110 is prepared, one sub-pixel corresponds to one mask opening. Specifically, a vacuum evaporation organic material is used, and an area and a shape of the organic material are controlled by using the mask opening in the FMM to form the sub-pixel.

However, since the FMM is generally limited by a minimum opening size and a minimum distance between openings, it is difficult to achieve both a high resolution and a high opening ratio for the display panel, that is, it is difficult to maintain the high opening ratio under the high resolution, otherwise, defects such as color mixing will easily occur. Based on this, the present disclosure provides a display panel and a display apparatus to reduce the difficulty of producing the FMM.

Referring to FIGS. 2 to 5, the present disclosure provides a display panel and a display apparatus. The display panel 10 includes a plurality of pixel structures 110, each of the pixel structures 110 is disposed in a hexagon, and the hexagon is divided into six triangles disposed around a center of the hexagon. One pixel structure 110 includes six closely arranged pixel units 111, and one pixel unit 111 is correspondingly disposed in one triangle. In one pixel unit 111 and one corresponding triangle, the pixel unit 111 includes three sub-pixels respectively disposed on three vertex angles of the triangle, and the three sub-pixels have different colors. In two adjacent pixel units 111, two adjacent sub-pixels located at the center of the hexagon have a same color, and two adjacent sub-pixels located at the vertex angles of the hexagon have a same color.

It can be understood that in the present disclosure, in the two adjacent pixel units 111, the two adjacent sub-pixels located at the center of the hexagon have the same color, and the two adjacent sub-pixels located at the vertex angles of the hexagon have the same color. Therefore, during preparation of the pixel structures 110, the two adjacent sub-pixels with the same color can share one opening in an FMM for evaporation, so that accuracy requirements for the FMM are reduced.

The following describes the technical solutions of the present disclosure with reference to specific embodiments.

Figure 2:
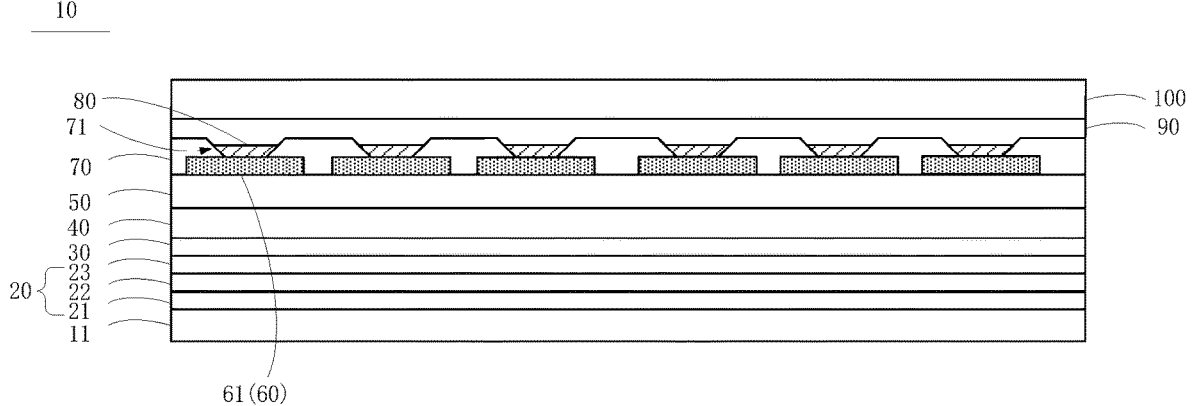
FIG. 2 is a schematic sectional view of a display panel according to an embodiment of the present disclosure.
Figure 3:
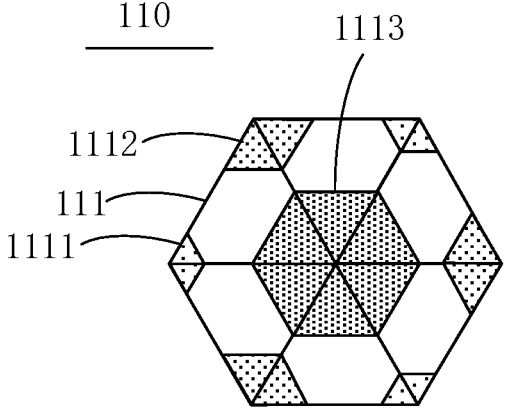
FIG. 3 is a first schematic diagram of a structure of a pixel structure of a display panel according to an embodiment of the present disclosure.

FIG. 2 is a schematic sectional view of a display panel according to an embodiment of the present disclosure; and FIG. 3 is a first schematic diagram of a structure of a pixel structure of a display panel according to an embodiment of the present disclosure.

The present embodiment provides a display panel 10. The display panel 10 includes, but not limited to, one of a light-emitting diode (LED) display panel or an organic light emitting diode (OLED) display panel 10, which is not specifically limited in the present embodiment. It should be noted that the technical solution of the present disclosure is described using an example in which the display panel 10 is the OLED display panel in the present embodiment.

In the present embodiment, the display panel 10 includes a glass base plate 11, a base 20, a buffer layer 30, an array base plate 40, a flat layer 50, a first metal layer 60, an organic light-emitting layer 80, a second metal layer 90, an encapsulation layer 100, and a pixel definition layer 70 disposed between the first metal layer 60 and the organic light-emitting layer 80 disposed in a stacked manner sequentially.

The base 20 includes a first substrate 21, a separation layer 22, and a second substrate 23 disposed in a stacked manner sequentially. The first substrate 21 and the second substrate 23 may be both rigid substrates or flexible substrates. When the first substrate 21 and the second substrate 23 are both the rigid substrates, a material may be metal or glass. When the first substrate 21 and the second substrate 23 are both the flexible substrates, a material may include at least one of acrylic resin, methacrylic resin, polyisoprene, vinyl-based resin, epoxy-based resin, polyurethane-based resin, cellulose resin, siloxane resin, polyimide-based resin, or polyamide-based resin. A material of the separation layer 22 includes, but is not limited to, silicon nitride (SiNx), silicon oxide (SiOx), and other materials having water absorbency. The materials of the first substrate 21, the second substrate 23, and the separation layer 22 are not limited in the present embodiment.

Each of materials of the first metal layer 60 and the second metal layer 90 includes at least one metal of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), or tungsten (W). The materials of the first metal layer 60 and the second metal layer 90 are not specifically limited in the present embodiment It should be noted that, in the present embodiment, the first metal layer 60 includes a plurality of first electrodes 61 spaced apart from each other. The second metal layer 90 includes a second electrode 91. The first electrode 61 includes, but is not limited to, an anode, and the second electrode 91 includes, but is not limited to, a cathode layer. The technical solution of the present disclosure is described using an example in which the first electrode 61 is the anode and the second electrode 91 is the cathode layer in the present embodiment.

In the present embodiment, the pixel definition layer 70 includes a plurality of opening regions 71 exposing a part of the electrodes, and the organic light-emitting layer 80 is located in the opening regions 71. Specifically, the organic light-emitting layer 80 includes a plurality of sub-pixels of different colors spaced apart from each other. One sub-pixel is disposed correspondingly in one opening region 71 and one sub-pixel is disposed corresponding to one first electrode 61. The sub-pixels include, but are not limited to, red sub-pixels, green sub-pixels, and blue sub-pixels.

In the present embodiment, the display panel 10 further includes a plurality of pixel structures 110. Each of the pixel structures 110 is disposed in a hexagon, and the hexagon is divided into six triangles disposed around a center of the hexagon. One pixel structure 110 includes six closely arranged pixel units 111, each of the pixel units 111 includes one first electrode 61, one sub-pixel, and the second electrode 91, and one pixel unit 111 is correspondingly disposed in one triangle. In one pixel unit 111 and one corresponding triangle, the pixel unit 111 includes three sub-pixels respectively disposed on three vertex angles of the triangle, and the three sub-pixels have different colors. In two adjacent pixel units 111, two adjacent sub-pixels located at the center of the hexagon have a same color, and two adjacent sub-pixels located at the vertex angles of the hexagon have a same color.

It should be noted that, an angle at which the hexagon is placed is not limited and the hexagon can rotate around a center point at will. This is not limited in the present embodiment.

It can be understood that in the present embodiment, in two adjacent pixel units 111, two adjacent sub-pixels located at the center of the hexagon have a same color and two adjacent sub-pixels located at the vertex angles of the hexagon have a same color. Therefore. during preparation of the pixel structures 110, the two adjacent sub-pixels of the same color can share one opening in an FMM for evaporation, so that the shortest distance between the two adjacent sub-pixels of the same color can be reduced, to reduce a positional deviation caused by evaporation, thus reducing accuracy requirements for the FMM. In addition, since the sub-pixels of the same color are close to each other, a color mixing phenomenon of the display panel 10 is reduced.

Further, each of the pixel units 111 includes a first color sub-pixel unit 1111, a second color sub-pixel unit 1112, and a third color sub-pixel unit 1113. The first color sub-pixel unit 1111 and the second color sub-pixel unit 1112 are respectively located at the two vertex angles of the triangle away from the center of the hexagon, and the third color sub-pixel unit 1113 is located at the vertex angle of the triangle close to the center of the hexagon. It can be understood that in the pixel structure 110, six adjacent sub-pixels of a same color are disposed around the center of the hexagon. Therefore, during preparation of the pixel structures 110, since the six adjacent sub-pixels of the same color can share one opening in an FMM for evaporation, that is, by using a structure of the pixel unit 111 in this implementation, one opening in the FMM can correspond to a maximum of six sub-pixels for evaporation, thus increasing the opening rate of the display panel 10 and satisfying high display performance requirements of the display panel 10.

In the present embodiment, the hexagon is a regular hexagon, the triangle is a regular triangle, and shapes of the three sub-pixels are triangles. Further, the shapes of the three sub-pixels are regular triangles. It can be understood that in the present embodiment, the hexagon is the regular hexagon, the triangle is the regular triangle, one pixel structure 110 includes six closely arranged pixel units 111, and one pixel unit 111 is correspondingly disposed in one triangle. In this way, a designer can conveniently obtain the entire pixel structure 110 by specifically designing only a structure of the pixel unit 111, to simplify the design and preparation process of the display panel 10. Moreover, the shapes of the three sub-pixels are the regular triangles, and in the pixel unit 111, the three sub-pixels are disposed at the three vertex angles of the triangle, to improve the space utilization rate, thus helping improve the opening rate and resolution of the display panel In the present embodiment, in each of the pixel units 111, the first color sub-pixel unit 1111 and the second color sub-pixel unit 1112 have a first distance, the first color sub-pixel unit 1111 and the third color sub-pixel unit 1113 have a second distance, and the second color sub-pixel unit 1112 and the third color sub-pixel unit 1113 have a third distance. The first distance is greater than the second distance and the second distance is greater than the third distance. Preferably, in each of the pixel units 111, a ratio of an area of the first color sub-pixel unit 1111 to an area of the second color sub-pixel unit 1112 to an area of the third color sub-pixel unit 1113 is 1:2.8:3.5.

Specifically, in the present embodiment, the first color sub-pixel unit 1111 is one of a red sub-pixel or a green group pixel unit 111, the second color sub-pixel unit 1112 is the other one of the red sub-pixel or the green group pixel unit 111, and the third sub-pixel is a blue sub-pixel. Further, In the present embodiment, the technical solution of the present disclosure is described using an example in which the first color sub-pixel unit 1111 is the red sub-pixel, the second color sub-pixel unit 1112 is the green group pixel unit 111, and the third sub-pixel is the blue sub-pixel.

It can be understood that in the present embodiment, the first distance is greater than the second distance and the second distance is greater than the third distance, so that the color mixing phenomenon between the sub-pixels of different colors can be effectively prevented and a display effect of the display panel 10 can be enhanced.

Meanwhile, in each of the pixel units 111, the ratio of the area of the first color sub-pixel unit 1111 to the area of the second color sub-pixel unit 1112 to the area of the third color sub-pixel unit 1113 is 1:2.8:3.5. The first color sub-pixel unit 1111 is the red sub-pixel, the second color sub-pixel unit 1112 is the green group pixel unit 111, and the third sub-pixel unit is the blue sub-pixel. The area of the third sub-pixel is greater than the area of the second sub-pixel, the area of the third sub-pixel is greater than the area of the first sub-pixel, and the luminous life of the third sub-pixel is increased by increasing the area of the third sub-pixel, so that the red sub-pixel, the green sub-pixel, and the blue sub-pixel have the same life, thus avoiding the phenomenon of color shift in a display screen after a long lighting time. Moreover, the opening rate of the pixel unit 111 can be increased to extend the service life.

Specifically, the first distance ranges from 10 um to 30 um, the second distance ranges from 10 um to 30 um, and the third distance ranges from 10 um to 30 um. It can be understood that the first distance, the second distance, and the third distance can be all limited according to actual requirements. This is not specifically limited in the present embodiment.

It should be noted that, in this implementation, in order to ensure the uniformity of the display of a layout structure of the pixel units 111, in one pixel unit 111, a same distance between any two different color sub-pixel units of the first color sub-pixel unit 1111, the second color sub-pixel unit 1112, or the third color sub-pixel unit 1113 may be set. In this implementation, the first distance, the second distance, and the third distance may be alternatively set to be the same. However, to improve the opening ratio of the display panel 10, the first distance is greater than the second distance and the second distance is greater than the third distance.

Figure 4:
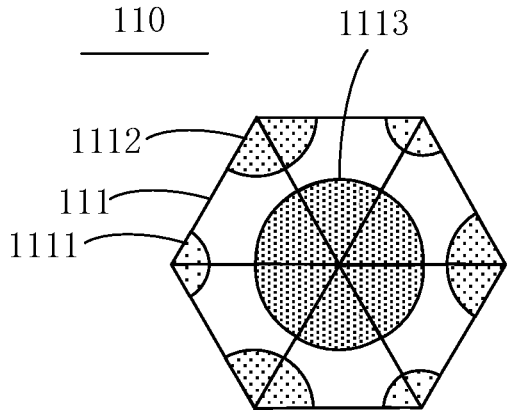
FIG. 4 is a second schematic diagram of a structure of a pixel structure of a display panel according to an embodiment of the present disclosure.

FIG. 4 is a second schematic diagram of a structure of a pixel structure of a display panel according to an embodiment of the present disclosure.

In the present embodiment, the structure of the pixel structure 110 is similar/identical to the first structure of the pixel structure 110 provided in the above embodiment. For details, reference is made to the description of the pixel structure 110 in the above embodiment. Details are not described herein again. A difference between the two lies in that:

in the present embodiment, shapes of the three sub-pixels are sectors and two sides of the sector overlap with two sides of the triangle. In the pixel structure 110, six adjacent third color sub-pixel units 1113 are closely arranged to form a shape similar to a circle, thus simplifying the design and preparation process of the pixel structure 110 of the display panel 10, and also reducing the accuracy requirements for the FMM.

Figure 5:
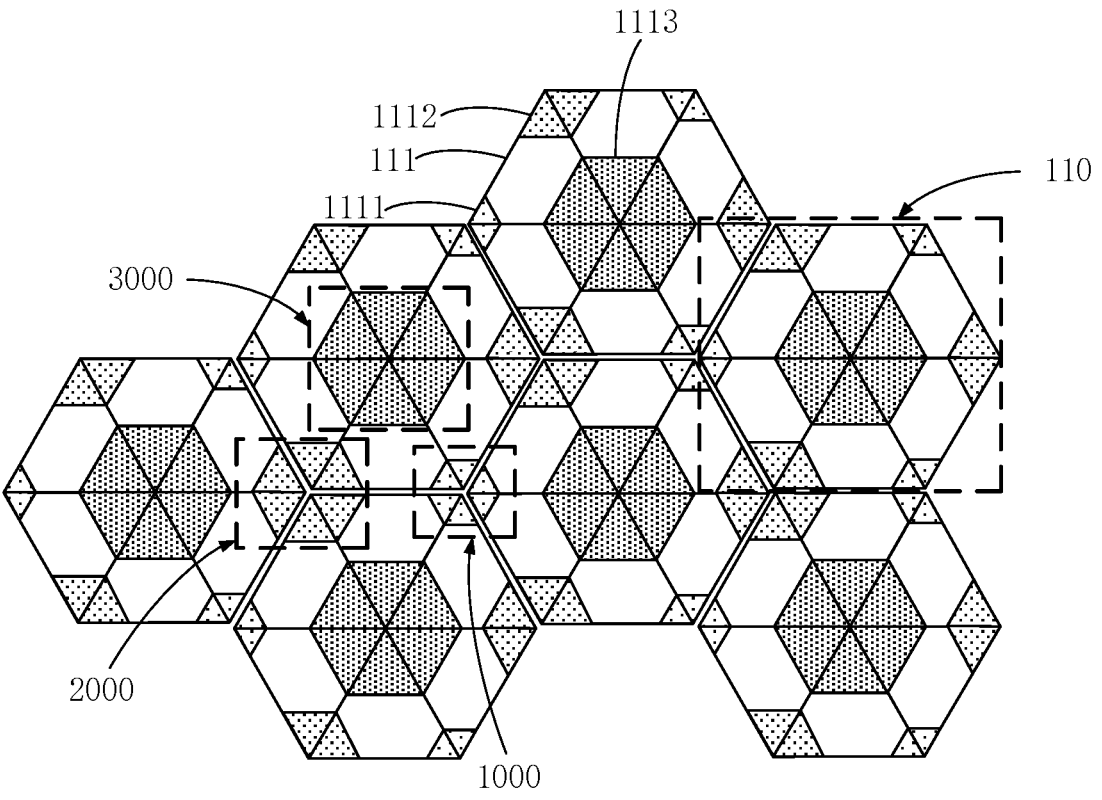
FIG. 5 is a top view of a plurality of pixel structures of a display panel according to an embodiment of the present disclosure.

FIG. 5 is a top view of a plurality of pixel structures of a display panel according to an embodiment of the present disclosure.

In the present embodiment, the display panel 10 includes a plurality of a first color sub-region 1000, a plurality of second color sub-regions 2000, and a plurality of third color sub-regions 3000. One third color sub-region 3000 is disposed at a center of one hexagon. In each of the pixel structures 110, any two adjacent third color sub-pixel units 1113 are adjacent to each other and are disposed in the third color sub-region 3000.

It can be understood that in one pixel structure 110, six adjacent sub-pixels of the same color are disposed around the center of the hexagon. Therefore, during preparation of the pixel structure 110, since the six adjacent third color sub-pixel units 1113 of the same color can share one opening in an FMM for evaporation, that is, by using the structure of the pixel unit 111 in this implementation, one opening in the FMM can correspond to a maximum of six color sub-pixel units 1113 for evaporation, thus increasing the opening rate of the display panel 10 and satisfying the high display performance requirements of the display panel 10.

Further, in the plurality of pixel structures 110, centers of the plurality of second color sub-regions 2000 and centers of the plurality of third color sub-regions 3000 are disposed on vertex angles of the hexagons. Three first color sub-regions 1000 and three second color sub-regions 2000 are correspondingly disposed on vertex angles of one hexagon, and the three first color sub-regions 1000 and the three second color sub-regions 2000 are alternately disposed.

Six first color sub-pixel units 1111 are disposed in one first color sub-region 1000, and any two adjacent first color sub-pixel units 1111 in the first color sub-region 1000 are adjacent to each other. Six second color sub-pixel units 1112 are disposed in one second color sub-region 2000, and any two adjacent second color sub-pixel units 1112 in the second color sub-region 2000 are adjacent to each other.

It can be understood that in a plurality of pixel structures 110, six first color sub-pixel units 1111 are disposed in one first color sub-region 1000, and any two adjacent first color sub-pixel units 1111 in the first color sub-region 1000 are adjacent to each other; and six second color sub-pixel units 1112 are disposed in one second color sub-region 2000, and any two adjacent second color sub-pixel units 1112 in the second color sub-region 2000 are adjacent to each other. Therefore, during preparation of the pixel structures 110, the six adjacent first color sub-pixel units 1111 of the same color in the first color sub-region 1000 can share one opening in an FMM for evaporation, and the six adjacent second color sub-pixel units 1112 of the same color in the second color sub-region 2000 can share one opening in the FMM for evaporation. In other words, by using the structure of the pixel unit 111 in this implementation, one opening in the FMM can correspond to a maximum of six first color sub-pixel units 1111 or six second color sub-pixel units for evaporation, thus reducing the accuracy requirements for the FMM while increasing the opening rate of the display panel 10, and satisfying the high display performance requirements of the display panel 10.

It should be noted that, in the present embodiment, a distance between any two adjacent pixel structures 110 of the plurality of pixel structures 110 ranges from 10 um to 30 um. It can be understood that the distance between any two adjacent pixel structures 110 of the plurality of pixel structures 110 may be limited according to actual requirements. This is not specifically limited in the present embodiment.

It should be noted that, in the present embodiment, a distance between any two adjacent pixel structures 110 of a plurality of pixel structures 110 ranges from 10 um to 30 um, so that a size of the opening in the FMM can be controlled, and then a suitable FMM is selected according to the actual requirements. In addition, the plurality of pixel structures 110 are disposed spaced apart from each other, to improve the uniformity of the display effect of the display panel 10.

The present embodiment further provides a display apparatus, including the display panel according to any one of the foregoing embodiments.

It can be understood that the display panel has been described in detail in the foregoing embodiments and will not be repeated here.

In specific applications, the display apparatus can be a display screen of devices such as a smartphone, a tablet computer, a notebook computer, a smart bracelet, a smart watch, smart glasses, a smart helmet, a desktop computer, a smart TV, and a digital camera, and even can be applied to an electronic device with a flexible display screen.

Based on the foregoing, the present disclosure provides a display panel and a display apparatus. The display panel includes a plurality of pixel units, each of the pixel structures is disposed as a hexagon, and the hexagon is divided into six triangles disposed around a center of the hexagon. One pixel structure includes six closely arranged pixel units, and one pixel unit is correspondingly disposed in one triangle. In one pixel unit and one corresponding triangle, the pixel unit includes three sub-pixels respectively disposed on three vertex angles of the triangle, and the three sub-pixels have different colors. In two adjacent pixel units, two adjacent sub-pixels located at the center of the hexagon have a same color, and two adjacent sub-pixels located at the vertex angles of the hexagon have a same color. The two adjacent sub-pixels of the same color can share one opening in an FMM for evaporation, so that the accuracy requirements for the FMM are reduced.

It can be understood that to a person of ordinary skill in the art, equivalent substitutions or changes may be made according to the technical solution of the present disclosure and its inventive concept, and all such changes or substitutions shall fall within the scope of protection of the claims appended to the present disclosure.

What is claimed is:

1. A display panel, comprising a plurality of pixel structures, wherein each of the pixel structures is disposed as a hexagon, the hexagon is divided into six triangles disposed around a center of the hexagon, one pixel structure comprises six closely arranged pixel units, and one pixel unit is correspondingly disposed in one triangle;

in one pixel unit and one corresponding triangle, the pixel unit comprises three sub-pixels respectively disposed on three vertex angles of the triangle, and the three sub-pixels have different colors; and in two adjacent pixel units, two adjacent sub-pixels located at the center of the hexagon have a same color, and two adjacent sub-pixels located at the vertex angles of the hexagon have a same color, wherein shapes of the sub-pixels are sectors, six adjacent sub-pixels located at the center of the hexagon are closely arranged to form a shape similar to a circle;

wherein each of the pixel units comprises a first color sub-pixel, a second color sub-pixel, and a third color sub-pixel, wherein the first color sub-pixel and the second color sub-pixel are respectively located at the two vertex angles of the triangle away from the center of the hexagon, and the third color sub-pixel is located at the vertex angle of the triangle close to the center of the hexagon;

wherein in each of the pixel units in one of the pixel structures, a first distance is defined between a farthest point on an arc of the sector of the first color sub-pixel away from the center of the hexagon and a farthest point on an arc of the sector of the second color sub-pixel away from the center of the hexagon, a second distance is defined between a closest point on the arc of the sector of the first color sub-pixel to the center of the hexagon and a first point on an arc of the sector of the third color sub-pixel, and a third distance is defined between a closest point on the arc of the sector of the second color sub-pixel to the center of the hexagon and a second point on the arc of the sector of the third color sub-pixel; wherein the closest point on the arc of the sector of the first color sub-pixel to the center of the hexagon and the first point on the arc of the sector of the third color sub-pixel are on one side of the triangle of the pixel unit, and the closest point on the arc of the sector of the second color sub-pixel to the center of the hexagon and the second point on the arc of the sector of the third color sub-pixel are on another side of the triangle of the pixel unit;

wherein the first distance is greater than the second distance and the second distance is greater than the third distance.

2. The display panel as claimed in claim 1, wherein in each of the pixel units, a ratio of an area of the first color sub-pixel to an area of the second color sub-pixel to an area of the third color sub-pixel is 1:2.8:3.5.

3. The display panel as claimed in claim 2, wherein the first color sub-pixel unit is one of a red sub-pixel or a green group pixel unit, and the second color sub-pixel unit is the other one of the red sub-pixel or the green group pixel unit.

4. The display panel as claimed in claim 1, wherein in any two adjacent pixel structures, two adjacent first color sub-pixels located at adjacent positions of two hexagons are disposed adjacent to each other, and two adjacent second color sub-pixels located at the adjacent positions of the two hexagons are disposed adjacent to each other.

5. The display panel as claimed in claim 4, comprising a plurality of first color sub-regions, a plurality of second color sub-regions, and a plurality of third color sub-regions, wherein in the plurality of pixel structures, centers of the plurality of third color sub-regions are disposed at centers vertex angles of the hexagons;

three first color sub-regions and three second color sub-regions are disposed at vertex angles of one hexagon correspondingly, and the three first color sub-regions and the three second color sub-regions are alternately disposed;

six first color sub-pixels are disposed in one first color sub-region, and any two adjacent first color sub-pixels in the first color sub-region are adjacent to each other; and six second color sub-pixels are disposed in one second color sub-region, and any two adjacent second color sub-pixels in the second color sub-region are adjacent to each other.

6. The display panel as claimed in claim 5, wherein in the plurality of pixel structures, a distance between any two adjacent pixel structures ranges from 10 um to 30 um.

7. A display apparatus, comprising a display panel, wherein the display panel comprises a plurality of pixel structures, each of the pixel structures is disposed as a hexagon, the hexagon is divided into six triangles disposed around a center of the hexagon, one pixel structure comprises six closely arranged pixel units, and one pixel unit is correspondingly disposed in one triangle;

in one pixel unit and one corresponding triangle, the pixel unit comprises three sub-pixels respectively disposed on three vertex angles of the triangle, and the three sub-pixels have different colors; and in two adjacent pixel units, two adjacent sub-pixels located at the center of the hexagon have a same color, and two adjacent sub-pixels located at the vertex angles of the hexagon have a same color, wherein shapes of the sub-pixels are sectors, six adjacent sub-pixels located at the center of the hexagon are closely arranged to form a shape similar to a circle;

wherein each of the pixel units comprises a first color sub-pixel, a second color sub-pixel, and a third color sub-pixel, the first color sub-pixel and the second color sub-pixel are respectively located at the two vertex angles of the triangle away from the center of the hexagon, and the third color sub-pixel is located at the vertex angle of the triangle close to the center of the hexagon;

wherein in each of the pixel units in one of the pixel structures, a first distance is defined between a farthest point on an arc of the sector of the first color sub-pixel away from the center of the hexagon and a farthest point on an arc of the sector of the second color sub-pixel away from the center of the hexagon, a second distance is defined between a closest point on the arc of the sector of the first color sub-pixel to the center of the hexagon and a first point on an arc of the sector of the third color sub-pixel, and a third distance is defined between a closest point on the arc of the sector of the second color sub-pixel to the center of the hexagon and a second point on the arc of the sector of the third color sub-pixel; wherein the closest point on the arc of the sector of the first color sub-pixel to the center of the hexagon and the first point on the arc of the sector of the third color sub-pixel are on one side of the triangle of the pixel unit, and the closest point on the arc of the sector of the second color sub-pixel to the center of the hexagon and the second point on the arc of the sector of the third color sub-pixel are on another side of the triangle of the pixel unit;

wherein the first distance is greater than the second distance and the second distance is greater than the third distance.

8. The display apparatus as claimed in claim 7, wherein in each of the pixel units, a ratio of an area of the first color sub-pixel to an area of the second color sub-pixel to an area of the third color sub-pixel is 1:2.8:3.5.

9. The display apparatus as claimed in claim 8, wherein the first color sub-pixel unit is one of a red sub-pixel or a green group pixel unit, and the second color sub-pixel unit is the other one of the red sub-pixel or the green group pixel unit.

10. The display apparatus as claimed in claim 7, wherein in any two adjacent pixel structures, two adjacent first color sub-pixels located at adjacent positions of two hexagons are disposed adjacent to each other, and two adjacent second color sub-pixels located at the adjacent positions of the two hexagons are disposed adjacent to each other.

11. The display apparatus as claimed in claim 10, comprising a plurality of first color sub-regions, a plurality of second color sub-regions, and a plurality of third color sub-regions, wherein in the plurality of pixel structures, centers of the plurality of third color sub-regions are disposed at centers of the hexagons;

three first color sub-regions and three second color sub-regions are disposed at vertex angles of one hexagon correspondingly, and the three first color sub-regions and the three second color sub-regions are alternately disposed;

six first color sub-pixels are disposed in one first color sub-region, and any two adjacent first color sub-pixels in the first color sub-region are adjacent to each other; and six second color sub-pixels are disposed in one second color sub-region, and any two adjacent second color sub-pixels in the second color sub-region are adjacent to each other.

12. The display apparatus as claimed in claim 11, wherein in the plurality of pixel structures, a distance between any two adjacent pixel structures ranges from 10 um to 30 um.

13. The display panel as claimed in claim 4, comprising a plurality of first color sub-regions, a plurality of second color sub-regions, and a plurality of third color sub-regions, wherein one third color sub-region is disposed at a center of one hexagon, and in each of the pixel structures, any two adjacent third color sub-pixels are adjacent to each other and are disposed in the third color sub-region.

14. The display apparatus as claimed in claim 10, wherein the display panel comprises a plurality of first color sub-regions, a plurality of second color sub-regions, and a plurality of third color sub-regions; and one third color sub-region is disposed at a center of one hexagon, and in each of the pixel structures, any two adjacent third color sub-pixels are adjacent to each other and are disposed in the third color sub-region.

* * * * *